United States Patent
Ma et al.

(10) Patent No.: US 11,239,289 B2
(45) Date of Patent: Feb. 1, 2022

(54) FOLDABLE AMOLED DISPLAY EMPLOYING ALL-IN-ONE SUBSTRATE AND AUXILIARY MEANS

(71) Applicants: Yao-Dong Ma, Frisco, TX (US); Blair Ma, Frisco, TX (US)

(72) Inventors: Yao-Dong Ma, Frisco, TX (US); Blair Ma, Frisco, TX (US)

(*) Notice: Subject to any disclaimer, the term of this patent is extended or adjusted under 35 U.S.C. 154(b) by 81 days.

(21) Appl. No.: 16/602,391

(22) Filed: Sep. 26, 2019

(65) Prior Publication Data
US 2021/0098544 A1 Apr. 1, 2021

(51) Int. Cl.
| | | |
|---|---|---|
| H01L 51/00 | (2006.01) | |
| H01L 51/56 | (2006.01) | |
| H01L 27/32 | (2006.01) | |
| H01L 51/52 | (2006.01) | |
| B32B 37/15 | (2006.01) | |
| B32B 17/10 | (2006.01) | |
| G02B 5/30 | (2006.01) | |

(52) U.S. Cl.
CPC .......... *H01L 27/3232* (2013.01); *B32B 17/10* (2013.01); *B32B 37/15* (2013.01); *H01L 51/0097* (2013.01); *H01L 51/5293* (2013.01); *H01L 51/56* (2013.01); *B32B 2307/42* (2013.01); *B32B 2457/206* (2013.01); *G02B 5/3016* (2013.01)

(58) Field of Classification Search
CPC ............. H01L 51/5293; H01L 27/3232; H01L 51/0097; H01L 51/56; B32B 2307/42; B32B 2457/206; B32B 17/10; B32B 37/15; G02B 5/3016
USPC ........................................ 257/40; 438/82, 99
See application file for complete search history.

(56) References Cited

U.S. PATENT DOCUMENTS

| | | | | |
|---|---|---|---|---|
| 5,742,368 | A * | 4/1998 | Chen | G02F 1/13725 349/117 |
| 2003/0112392 | A1* | 6/2003 | Moon | G02F 1/133514 349/115 |
| 2013/0021667 | A1* | 1/2013 | Tsuburaya | G02B 27/286 359/489.07 |
| 2018/0037739 | A1* | 2/2018 | Hida | C09B 43/003 |
| 2018/0095502 | A1* | 4/2018 | Yamazaki | G06F 1/1643 |
| 2018/0319201 | A1* | 11/2018 | Koga | B43K 23/001 |
| 2020/0013838 | A1* | 1/2020 | Takechi | H01L 51/5234 |

* cited by examiner

*Primary Examiner* — Didarul A Mazumder

(57) ABSTRACT

The present invention relates to an AMOLED display, more specifically, to an AMOLED display employing an ultra-thin all-in-one substrate and an auxiliary supporting means to achieve true foldable display devices.

3 Claims, 5 Drawing Sheets

FOLDABLE AMOLED DISPLAY EMPLOYING ALL-IN-ONE SUBSTRATE AND AUXILIARY MEANS

FIELD OF THE INVENTION

The present invention relates to an AMOLED display, more specifically, to an AMOLED display employing an ultra-thin all-in-one substrate and an auxiliary supporting means to achieve true foldable display devices.

BACKGROUND OF THE INVENTION

Currently, flexible displays, such as an active matrix organic light emitting display (AMOLED) and a passive transparent display are hotspots in the information industry. AMOLED displays are displays with an active matrix OLED panel. The idea of a foldable light emitting display panel was largely inspired by the characteristics of the OLED panels which can be contorted, yet, the image quality will remain unchanged.

A flexible display may be manufactured by using a flexible material, e.g., by replacing a glass substrate with a plastic film. Also, a foldable display device may be manufactured by using a flexible material in a foldable part thereof. Applications for foldable display devices are varied. For example, the flexible display device may be used in electronic books that may replace publications including magazines, textbooks, comic books, or the like, and portable information technology products, such as a personal computer that may be carried while its display is folded or rolled, a smart phone allowing real-time information communication, or the like. Accordingly, there is an increasing demand for the development of an interface capable of reflecting a characteristic of the flexible display device and using merits of the flexible display device.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants. OLEDs make use of thin organic films that emit light when voltage is applied across the device. On the other hand, the outstanding thermal properties of polyimides make them natural candidates as a substrate of the OLED display. By using specifically designed monomers, soluble polyimides have been prepared and casted into highly transparent films. In fact, such films have found commercial success as negative compensation films and alignment layer for LCD substrates. Two commercial polyimide films, Kapton® of Dupont Co (USA) and Upilex of Ube Co (Japan) have excellent mechanical properties with glass transition temperature (Tg) higher than 350° C. Due to their insolubility, they must be prepared from precursor polyamic acid films. Polyimide films usually have a relatively low CTE (the CTE of a Upilex film can be <10 ppm/° C.), and a very high birefringence (for a Upilex film, this value can be >0.1). AMOLED grade polyimide film has been commercialized in recent years with high optical transmittance, near zero birefringence, a relatively low CTE and a high Tg.

With the development of flexible display screen, expectations for foldable display products have become increasingly demanding. Theoretically, the OLED polyimide film could be made very thin, thus the bending radius could be small enough to realize a possibly true foldable AMOLED display. However, the current AMOLED displays have a multi-layer lamination structure, for example, the polyimide substrate as the backplane of the display has to attach a circular polarizer film in order to enhance the contrast ratio of the display. The circular polarizer normally consists of a linear polarizer and quarter wave retarder laminated by an optical clear adhesive (OCA).

Mechanically, with decreasing bend radius of folding area, the foldable product itself do not have enough flexibility to completely release the stress during the folding and unfolding operations, which results in delaminating, buckling, cracking or other product damages. As bending radii for flexible and foldable displays become smaller and smaller, the stresses and strains become larger. For foldable displays, there are many factors that must be taken into consideration to avoid films delaminating or cracking. OLEDs in particular have been shown to withstand bending to radius of curvature around 1 mm, and organic and oxide TFTs have shown themselves also to be very flexible when patterned into small islands. Design approaches that advantageously utilize the neutral plane for minimizing strain have been previously proposed. For example, positioning thin film photonic devices at the neutral plane inside a multi-layer stack has been suggested for minimizing strain during bending. See Juejun Hu et al., "Flexible integrated photonics: where materials, mechanics and optics meet [Invited]," Opt. Mater. Express 3, 1313-1331 (2013).

To further improve flexibility, backplane components of the AMOLED should be constructed of organic materials wherein the overall thickness of the material should be as thin as possible. Meanwhile, it is absolutely necessary to provide a mechanical auxiliary means for assisting folding and unfolding of the flexible display screen to modify the deformational stress.

SUMMARY OF THE INVENTION

It is the primary objective of the present invention to realize an ultra-thin foldable AMOLED display.

It is another objective of the present invention to fabricate a polyimide quarter wave retardation film as the substrate of AMOLED display.

It is also another objective of the present invention to utilize a liquid crystal polarizer on the AMOLED substrate.

It is again another objective of the present invention to make a true foldable display by an auxiliary supporting means.

It is also another objective of the present invention to make a foldable display structure with a static auxiliary supporting means.

It is still another objective of the present invention to create a foldable display structure with a dynamic auxiliary supporting means.

It is also another objective of the present invention to make a +180° folding AMOLED display.

It is again another objective of the present invention to make a −180° folding AMOLED display.

It is yet another objective of the present invention to create a roll-to-roll flexible production process to fabricate quarter wave retardation film.

It is still another objective of the present invention to create a panel-by-panel rigid production process to obtain a polyimide AMOLED substrate.

It is the final objective of the present invention to obtain a concave and convex dual-mode foldable AMOLED display.

DETAILED DESCRIPTION OF THE INVENTION

Figure 1:
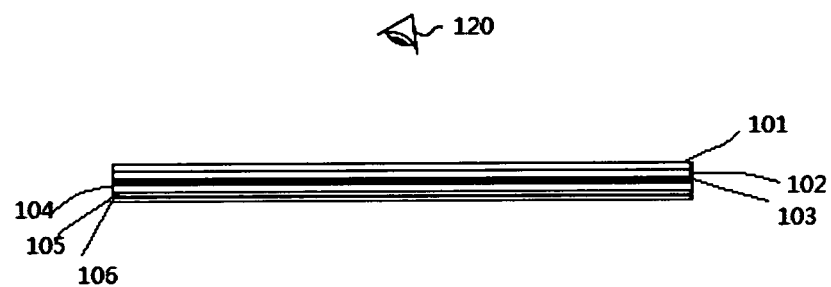
FIG. 1 illustrates a schematic structure of a prior art AMOLED display.

Referring first to FIG. 1, illustrated is a prior art flexible AMOLED display structure. The linear polarizer 101, including at least one layer of protection TAC film and a polarizer core film, is laminated with a polycarbonate quarter-wave retardation film 102 with their optical axis at 45 degrees each other to form a circular polarizer. The circular polarizer normally is of at least 140 microns in thickness, which is essential to ensure the maximum contrast ratio and the weather stability of the AMOLED display. The optical clear adhesive (OCA) layer 103 is a polyacrylate pleasure sensitive adhesive with the thickness at least 15 microns. A transparent polyimide film 104 works as a main substrate or the backplane of the AMOLED, wherein organic and inorganic active matrix components, built on the surface of the backplane, are typically composed of stiffer materials. For example, within a typical AMOLED backplane, the transistors are often composed of stiff materials. To improve flexibility, the transistors are constructed to be small in size and isolated from each other in "islands" as this improves flexibility of the transistor array within the backplane. An OLED layer 105 is a stack of organic materials sandwiched between two electrodes (not shown). Finally an encapsulation layer 106 is attached on to the back of the AMOLED display as a protection coating. The AMOLED light emitting functional film structure, including backplane 104, OLED thin film 105 and the encapsulation layer 106, has substantially the same thickness as the circular polarizer positioned on the viewer 120 side of the display.

For foldable displays, there are many factors that must be taking into consideration to avoid film's delaminating and cracking. It is well known in the art that the thicker the film is, the larger the bending radii will be in order to withstand the folding and unfolding deformation. On the other hand, there are at least two layers of OCA in FIG. 1, which is very susceptible to delaminating or degumming under high tensile stress: the first layer is located between the linear polarizer 101 and the quarter wave retarder 102, and the second layer is between the retarder 102 and the backplane substrate 104. As the bending radii for foldable display become smaller and smaller, the stress and strain become larger. It is proved that the OLED layer 105 will be able to withstand bending to radius of curvature around 1 mm, so one of the key issues for the foldable display is to reduce the thickness of the circular polarizer film as well as the polyimide backplane. Obviously, the multilayer structure as shown in FIG. 1 is least amenable to be bent and flexed to the very tight radii of curvature.

Figure 2:
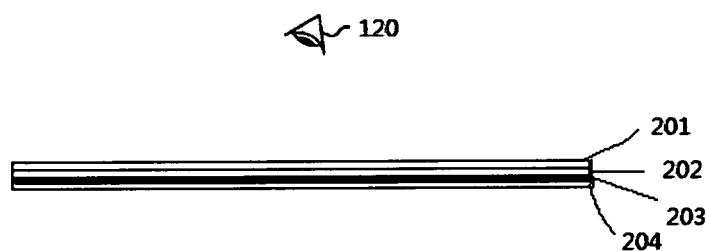
FIG. 2 illustrates a schematic structure of an ultra-thin all-in-one AMOLED display.

Turning now to FIG. 2, illustrated is an all-in-one structure of the present invention. On the viewer 120 side of the structure, it comes a thin crystalline film 201 functioning as a dichroic linear polarizer. The crystalline film may be formed according to the method described below from lyotropic liquid crystal (LLC) coating formulation containing 12.5% mixture of dyes Vat Blue 4; bis-benzimidazole-[2,1-a: 1'2'b']anthra[2,1,9-def:6,5,10-d'e'f']diisoquinoline-6, 9-dion; Vat Red 15 in the ratio 5.2:2:1). The LLC is transferred into an insoluble from after being treated with Barium ions. The thickness of the crystalline film 201 is about 100 nm. U.S. Pat. No. 6,847,420 teaches the optical characteristics of the thin polarizer film, herein incorporated by reference. Suitable organic materials include indanthrone (Vat Blue 4), dibenzoimidazol 1,4,5,8-naphthalenetetracarboxilic acid (Vat Red 14), dibenzoimidazole 3,4,9,10-perylentatracorboxilic acid, quinacridone (Pigment Violet 19), or other materials. The derivatives of the above listed materials or their mixtures form stable lyotropic liquid crystal phase.

Underneath the thin crystalline film is a transparent polyimide quarter wave retardation film 202, which works also as the backplane of the AMOLED display with the thickness approximately 20~50 microns. Due to the direct coating process of the polarizer film 201 on the polyimide retarder film 202, there is no OCA layer involved between them. The production of the polyimide retardation film 202 will be described in detail later. One may notice the fact that since the polyimide film in the present invention allows the polyimide material to have a high optical birefringence or refractive index, the novel quarter wave polyimide retardation film can be fabricated even thinner than 20 microns, which may further reduce the total thickness of the AMOLED display.

An OLED layer 203 is a stack of organic materials sandwiched between two electrodes (not shown). Finally an encapsulation layer 204 is attached on to the back of the AMOLED display as a protection coating. The AMOLED light emitting active matrix structure, including polarizer thin film 201, backplane 202, OLED thin film 203 and the encapsulation layer 204, has substantially the same thickness as an ordinary white paper with the thickness in the range of 20~120 microns. Obviously, such an ultra-thin AMOLED assembly of the present invention will minimize the difference between the inner and the outer radii of the flexible displays. Therefore, one of the advantageous characteristics of the state of art technology in the present invention is that it is possible to produce not only one-dimensional foldable display but two-dimensional bendable display as well.

Figure 3A:
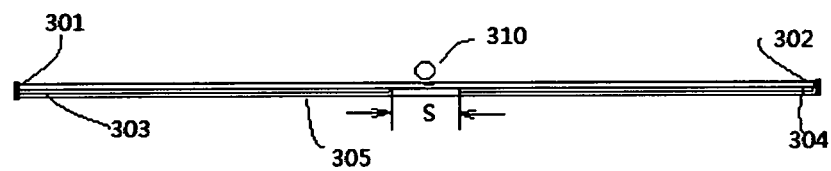
FIG. 3a illustrates a schematic structure of a static supporting means of an unfolding AMOLED display.
Figure 3B:
FIG. 3b illustrates a schematic structure of a static supporting means of a folding AMOLED display.

Turning now to FIG. 3, illustrated is a schematic sectional structure of a foldable AMOLED display wherein a static axle pin 310 is positioned at the center of the display with an enlarged diameter to describe the principle of the present invention. The diameter center of the pin 310 is the folding axis of the foldable display. There are two modes in the structure: display mode as shown in FIG. 3a and non-display mode as shown in FIG. 3b. In the display mode, the left part of the front surface (left wing) 301 and the right part of the front surface (right wing) 302 are in the same plane as shown in FIG. 3a; while in the non-display mode, the "S" section of AMOLED film in the center area will wrap contouring the axle pin and those two wings will face together as shown in FIG. 3b. There are two compartments of the display, left compartment 303 and right compartment 304, containing display's driver, controller, main board, terminals, sensors and battery and so on. Back cover 305 encloses two compartments and links both left wing 301 and the right wing 302 of the display panel. The back cover, especially the "S" portion of the back cover, can be made of a rubber material such as polysilicon, polyurethane, or any other natural and artificial plastic-rubber copolymers in order to absorb the folding and unfolding stress. The dimension of the "S" portion should be satisfied with the following equation:

$$\pi D \leq S \leq 2\pi D \quad (1)$$

where S is the distance of free AMOLED film between two compartments and D represents the diameter of the axle pin respectively. More preferably, $S=1.5\pi D$. The diameter of the axle pin should be chosen as follows:

$$5T \leq D \leq 10T \quad (2)$$

where T represents the thickness of the AMOLED film.

The axle pin 310 as a supporting means of the folding display may be a whole rib rod, a strain of beats across the display or shift pins located at the two edges of the display panel, as long as the structure can be able to support the curvature of the folding display effectively. Optically, the supporting pin can be either transparent or opaque, depending on the design of the axle pin structure.

Alternately, the area that is designated for a supporting pin can be made more functional with the addition of a stylus with the same radius as the pin. The stylus would be attached to the center of the folding crease via magnets, and would be detached once the screen is folded open as an input pen.

Turning now to FIG. 4, illustrated is a schematic structure of a dynamic two-way foldable AMOLED display, wherein movable rolling spacers 410 and 420 are attached on the front display surface and on the back cover surface respectively. Similar to an abacus, a calculating panel invented 2600 years ago, the rolling spacer can be moved back and forth freely by finger, gravity or mechanical means, such as a micro-motor or a torch chain. It also can be stopped at predetermined positions, for example, end points anchored by pins 412, 422 and center point by a stopper 411.

Figure 4A:
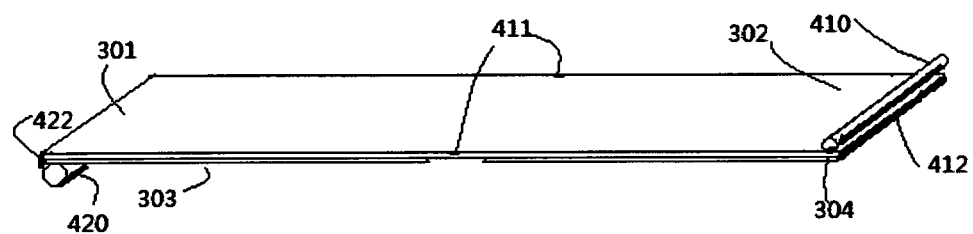
FIG. 4a illustrates a schematic structure of a dynamic means of an unfolding AMOLED display.

As shown in FIG. 4a, the AMOLED allows a viewer to watch a full screen image as a note-book flat panel. The roller spacer may be positioned at the end of the display. The function is the same as what is described in FIG. 3a.

Figure 4B:
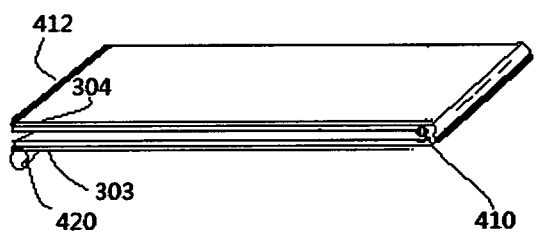
FIG. 4b illustrates a schematic structure of a dynamic means of the first folding structure of the AMOLED display.

When the display works in the first folding mode as shown in FIG. 4b, the display will be folding concavely into a non-display mode, wherein the roller 410 is sliding into the position of 411 in the middle of the display screen and the display is folding contouring the roller into inward face-to-face configuration. Meanwhile, the left and the right portion of the back cover 303, 304 will fold up to protect the display screen from abrading, scratching, smearing or light exposing so as to prolong the life time of the AMOLED display. Technically, it is defined that the concavely folding is categorized as +180° folding.

Figure 4C:
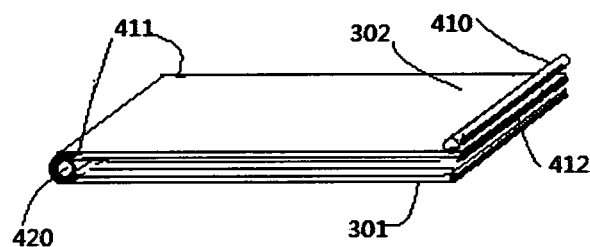
FIG. 4c illustrates a schematic structure of a dynamic means of the second folding structure of the AMOLED display.

When the display works in the second folding mode as shown in FIG. 4c, the display will be folding convexly into a half-display mode or smart phone mode, wherein the roller 420 is sliding into the position of 411 in the middle of the display screen and the display panel is folding contouring the roller 420 into outward back-to-back configuration so that a viewer can discern images on either side of the display. Meanwhile, the left and the right portion of the back cover 303, 304 will fold up inside the display device. Thus, it also can be defined that the convexly folding is categorized as −180° folding.

As described in the above-mentioned embodiment, the dual-folding means of the present invention differentiates itself monumentally from the prior art folding technologies wherein only one folding means has been introduced, either the +180° folding or the −180° folding.

Turning now to FIG. 5, illustrated is another schematic structure of a dynamic two-way foldable AMOLED display, wherein movable rolling spacers 510 and 520 are linked together to form a "nip" on the front display surface and on the back cover surface respectively. The nip structure means that the spacer 510 and 520 are opposite each other and always link together driven by a micro-motor.

Figure 5A:
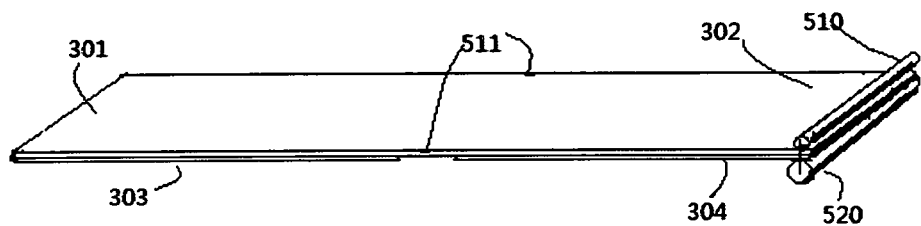
FIG. 5a illustrates a schematic structure of another dynamic means of an unfolding AMOLED display.

As shown in FIG. 5a, the AMOLED allows a viewer to watch a full screen image as a note-book display. The roller nip is positioned at the end of the display.

Figure 5B:
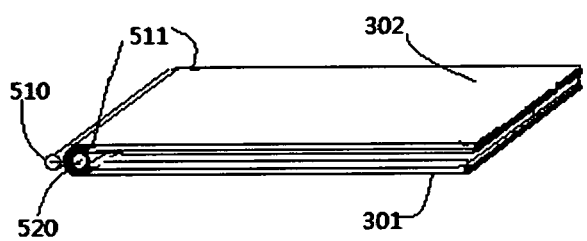
FIG. 5b illustrates a schematic structure of another dynamic means of the first folding structure of the AMOLED display.

When the display works in the first folding mode as shown in FIG. 5b, the display will be folding convexly into a half-display mode or smart phone mode, wherein the roller 520 is sliding into the position of 511 in the middle of the display screen and the display panel is folding contouring the roller 520 into outside back-to-back configuration so that a viewer can discern images on either side of the display. Meanwhile, the left and the right portion of the back cover will fold inside the display device. It also can be defined that the convexly folding is as −180° folding.

Figure 5C:
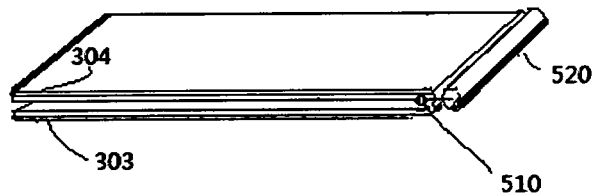
FIG. 5c illustrates a schematic structure of another dynamic means of the second folding structure of the AMOLED display.

When the display works in the second folding mode as shown in FIG. 5c, the display will be folding concavely into a non-display mode, wherein the roller 510 is sliding into the position of 511 in the middle of the display screen and the display is folding contouring the roller into inside face-to-face configuration. Meanwhile, the left and the right portion of the back cover 303, 304 will fold facing outside to protect the display screen from abrading, scratching, smearing or light exposing so as to prolong the life time of the AMOLED display. It is defined that the concavely folding is as +180° folding.

Figure 6:
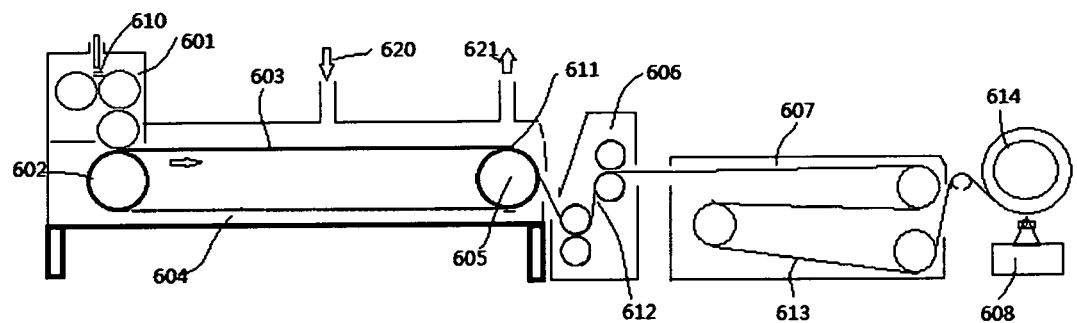
FIG. 6 illustrates a schematic structure of a roll-to-roll process of the precursor polyimide retardation film production.

Turning now to FIG. 6, illustrated is a schematic roll-to-roll production process of alicyclic retardation film. The process consists of the following steps:

1. Preparation of a Polyimide Precursor, Polyamic Acid (PAA) Solution 600 g of 2,2-bis [4-(4-aminophenoxy) phenyl] hexafluoropropane and 5000 g of N, N-dimethylacetamide were added into a 10 L reactor equipped with a DC stirrer, followed by stirring performed at room temperature in a nitrogen atmosphere. After 1 hour, 298 g of bicyclo [2.2.2] oct-7-ene-2,3,5,6-tetracarboxylic dianhydride were added several times during 1 hour, followed by 10 hours of stirring. The obtained polyamic acid (PAA) solution had a viscosity of approximately 3500 poise. The slurry was then placed in a freezer with the storage temperature at −20° C.

2. Casting and Pre-Drying into PAA Film

Before applying the slurry 610 to a coater, 18-inch reverse 3-roller coating head 601, make sure the PAA mixture is back to the room temperature. The reverse coater, including a doctor roll, a metering roll and an application roll, applied a uniform PAA web 611 onto a 24-inch polyester belt 603 with the thickness of in the range of 0.1~0.8 mm. A stainless drum 602 worked as both back roller of the coater and the tension speed controller of the conveyer. The drying chamber 604 was under nitrogen purge 620 and solvent ventilation 621 above the room temperature, allowing the web drying uniformly to a predetermined solid content.

3. MDO Stretching, Post-Drying and Rewinding

The film 612, containing approximately 15% solvent, was peeled off from the polyester belt and guided into a machine direction orientation (MDO) stretching machine 606 wherein the multiple nip rollers, at a controllable differential speed, stretched the film into a predetermined ratio in length along the motion direction. Normally the stretching ratio is in the range of 1.1~2.0, depending on the thickness of the PAA film. Among other parameters of the MDO machine, the precisely controlled temperature of the rollers and the environment is crucial to the uniformity of the retardation film. The resulting stretched film 613 is then traveling inside the serpentine oven 607 to dry out the remaining solvent and finally being winded up into a roll at a rewinding station 614.

Figure 7:
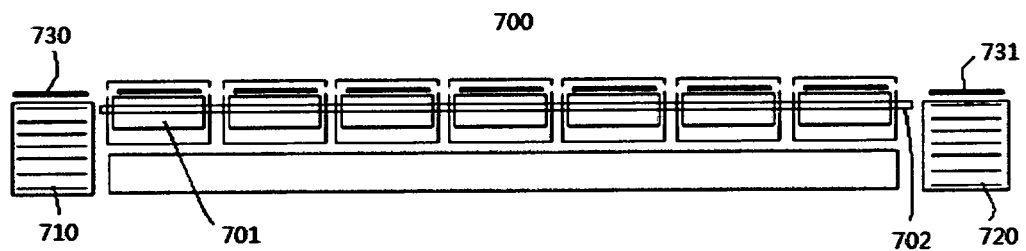
FIG. 7 illustrates a schematic sectional structure of a panel-by-panel process of the post-cured polyimide retardation film production.

Turning now to FIG. 7, illustrated is a schematic panel-by-panel production process of alicyclic polyimide AMOLED substrate film. The process consists of the following steps:

1. Glass Lamination

The quarter wave retarder film produced in FIG. 6 was unwinded and cut into 370 mm×470 mm sheets. Meanwhile, a polished 370 mm×480 mm glass, which had already printed with a homogeneous polyimide precursor adhesive layer, laminate with the redarder film and positioned into the basket of the robotic loader 710.

2. Polyimide Post-Cure

Now, there are two layers of polyamic acid film on the glass substrate: non-birefringence bottom layer and quarter wave retardation top layer. Both will be post-cured into polyimide simultaneously.

The laminated glass 730 was carried on to the hot plate 701 by a robotic conveyer 702 in a way of step-and-repeat and through a 20 meter-long PI oven 700 wherein the temperature profile was pre-programmed and the middle highest curing zoom was set up to 350° C. Nitrogen was purged into the oven constantly to avoid any side reaction. The duration of the polyimide post-curing process is normally 30~90 mins.

Finally the polyimide film 731 attached on the glass was transferred into basket 720 for further AMOLED processing. The dimension of the glass and the film lamination can be compatible with the standard AMOLED production line, which is much smaller than that of the LCD nowadays. The polyimide film has an alicyclic hydrocarbon structure as shown in formula I:

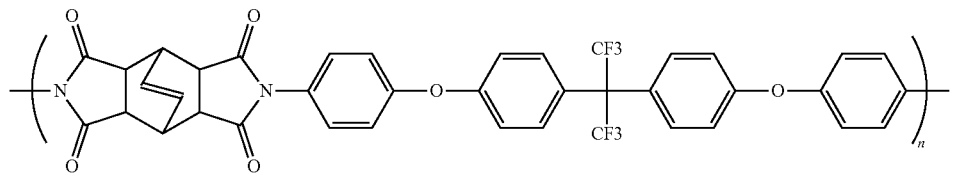

It should be understood that these embodiments are only purposed to illustrate the invention but not intended to limit the scope of the invention.

The invention claimed is:

1. A foldable OLED polyimide backplane fabrication process comprising:
   a. roll-to-roll film web process, and
   b. panel-by-panel conveyer process,
   wherein the roll-to-roll film web process guides a polyimide precursor PAA solution casting into a web, stretching into a quarter wave retarder and drying into a roll of polyamic acid film; wherein the panel-by-panel process allows the polyamic acid film to laminate onto a polyimide precursor coated glass panel, to post-cure into a polyimide film on a hot-plate station and proceed to carry out an AMOLED production; wherein the polyimide film is finally peeled off from the glass panel; whereby the foldable OLED polyimide backplane fabrication process turns out a predetermined foldable display panel.

2. The foldable OLED polyimide backplane fabrication process as in claim 1, wherein the polyimide precursor coated glass panel is a non-birefringence homogeneous polyamic acid thin film.

3. The foldable OLED polyimide backplane fabrication process as in claim 1, wherein the roll-to-roll film web process is a continuous polyimide retardation film production line.

* * * * *